(12) United States Patent
Shirasaki

(10) Patent No.: US 8,652,711 B2
(45) Date of Patent: Feb. 18, 2014

(54) PELLICLE FOR LITHOGRAPHY

(75) Inventor: Toru Shirasaki, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 276 days.

(21) Appl. No.: 13/373,442

(22) Filed: Nov. 15, 2011

(65) Prior Publication Data
US 2012/0122024 A1 May 17, 2012

(30) Foreign Application Priority Data

Nov. 17, 2010 (JP) ................................. 2010-256482

(51) Int. Cl.
*G03F 1/64* (2012.01)
*G03F 1/62* (2012.01)

(52) U.S. Cl.
USPC .............................................................. 430/5

(58) Field of Classification Search
USPC ........................................ 430/5, 322; 378/35
See application file for complete search history.

(56) References Cited

U.S. PATENT DOCUMENTS

| | | |
|---|---|---|
| 4,861,402 A | 8/1989 | Gordon |
| 2006/0257754 A1 | 11/2006 | Harubayashi et al. |
| 2009/0029269 A1 | 1/2009 | Shirasaki |

FOREIGN PATENT DOCUMENTS

| | | |
|---|---|---|
| JP | S58-219023 | 12/1983 |
| JP | S63-027707 | 2/1988 |
| JP | H07-168345 | 7/1995 |
| JP | H07-175206 A | 7/1995 |
| JP | 2009-025560 | 2/2009 |

OTHER PUBLICATIONS

Richard Wistrom et al., "Influence of the pellicle on final photomask flatness", Proceedings of SPIE, SPIE, US, vol. 628326-1-628326-7, XP002464928, ISSN: 0277-786X, DOI: 10.1117/12.681775.

*Primary Examiner* — Stephen Rosasco
(74) *Attorney, Agent, or Firm* — Manabu Kanesaka

(57) ABSTRACT

There is provided a pellicle in which the mask-bonding agglutinant layer has the adhesion strength of 1 N/m through 100 N/m, preferably 4 N/m through 80 N/m, and more preferably the agglutinant layer has a facial flatness of 15 micrometers or smaller, and still more preferably the membrane-bonding adhesive layer has a facial flatness of 15 micrometers or smaller: for the purpose of better preventing the pellicle frame from affecting the mask to deform.

4 Claims, 2 Drawing Sheets

F I G. 3
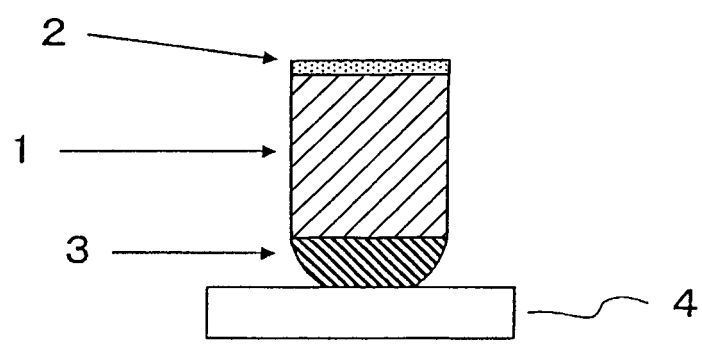

PELLICLE FOR LITHOGRAPHY

The present non-provisional application claims priority, as per Paris Convention, from Japanese Application No. 2010-256482 filed on Nov. 17, 2010, the disclosure of which is hereby incorporated by reference herein in its entirety.

FIELD OF THE INVENTION

This invention concerns a pellicle for lithography used as a dust-fender employed in lithographic printing to manufacture semiconductor devices especially such as LSI and super LSI.

TECHNICAL BACKGROUND OF THE INVENTION

In manufacturing semiconductor devices such as LSI and super-LSI or in manufacturing a liquid crystal display board or the like, a pattern transferring is conducted by irradiating light to an exposure original plate such as a semiconductor wafer or an original plate for liquid crystal, but if a dust particle exists adhering to the exposure original plate, the dust particle absorbs the light or refracts it, giving rise to deformation of a transferred pattern and roughened edges, which lead to problems such as a damaged dimension, a poor quality and a deformed appearance, lowering the performance and the manufacture yield of the semiconductor devices and the liquid crystal display board.

Thus, these works are usually performed in a clean room, but it is still difficult to keep the exposure original plate in a dust-free state all the time; therefore, a pellicle, which transmits the exposure light well, is attached to a surface of the exposure original plate as a dust-fender.

Under such circumstances, dust does not directly adhere to the surface of the exposure original plate but only onto the pellicle membrane, and thus, in lithography operation, by setting a photo focus on the pattern formed on the exposure original plate, the dust particles on the pellicle membrane fail to cast their shadows in the image transfer performance.

A pellicle is built up of a pellicle frame, which is usually made of aluminum or a stainless steel or polyethylene or the like, and a transparent pellicle membrane usually made of cellulose nitrate or cellulose acetate or a fluorine-containing resin or the like, which transmits light well; this membrane is attached to one of the two annular face of the frame (hereinafter referred to as "upper annular face") after laying a solvent capable of dissolving the pellicle membrane on the upper annular face and drying the solvent by air flow (ref. Publication-in-IP 1), or after laying an adhesive such as acrylic resin and epoxy resin (ref. Publications-in-IP 2, 3 and 4); furthermore, on the other one of the two annular faces of the frame (hereinafter referred to as "lower annular face") is laid an adhesive layer made of a polybutene resin, a polyvinyl acetate resin, an acrylic resin, a silicone resin or the like, and over this adhesive layer (hereinafter also referred to as "agglutinant layer") is laid a releasable liner (separator) for protecting the agglutinant layer.

In recent years, the requirement for the resolution of lithography has become heightened gradually, and in order to attain such higher resolutions the light sources having shorter and shorter wavelengths have come to be adopted. In practice, ultraviolet lights [g-line (436 nm), i-line (365 nm), KrFexcimer lasers (248 nm)] are newly employed, and more recently ArFexcimer lasers (193 nm) have begun to be used.

However, as the wavelengths of the exposure lights are shifted toward zero side, a new problem has arisen wherein a deformation of the lithographic image is caused by the deformed flatness of exposure original plate (mask).

It has been pointed out that one of the causes for the deformation of the flatness of the exposure original plate is the less admirable flatness of the pellicle which is attached to the exposure original plate.

The inventor hereof previously presented a proposal for controlling the mask deformation caused by pellicle attachment to the mask by means of an improvement in the flatness of the mask-bonding agglutinant layer (ref. Publication-in-IP 5).

In this Publication-in-IP 5, it is proposed to make flatter the surface of the mask-bonding agglutinant layer laid on an annular face of the pellicle frame by pressing the pellicle frame on a flat plate having a high flatness by the weight of the pellicle frame itself.

That invention certainly improved the maintenance of the high flatness of the mask greatly; however, there have still been occasional incidents observed wherein the transferred light image was deformed, especially in the cases wherein the masks are exposed to lights of shorter wavelengths. The cause for this deformation was looked for and it was found that when applied to the mask surface the agglutinant layer undergoes a deformation and this deformation is maintained by the power of the layer's adhesiveness and thereby a deformation stress in retained internally.

Thus, when the pellicle is being attached to the mask, the membrane-side face of the pellicle is touched with pressure by a pressure plate of a pellicle mounter (whereby the pellicle frame becomes more flatted), and on this occasion, if the membrane-bonding adhesive layer has an unevenness, the convex parts are pressed with greater forces than the concaved parts are. Then, even if the (mask-side) surface of the agglutinant layer is finished sufficiently flat, that part of the agglutinant layer which corresponds to the convex part of the adhesive layer receives more pressure, and as the result the side faces of the agglutinant layer receiving greater pressure bulge (creep) and thereby get in contact with the mask.

When the pressure plate is removed from the pellicle after the pressing operation is over, the pellicle frame freed from the pressure tries to revert to its former shape (which is comparatively more deformed than when under pressure). Thus as the pressure plate is removed and the pressure is gone the pellicle frame deforms again but as the agglutinant has a certain degree of adhesion strength, that part of the agglutinant which has bulged and contacted with the mask keeps sticking to the mask without returning to the former position, and as the result to compensate this the mask is pulled by the pellicle frame especially strongly at such bulged agglutinant portions, and thus the mask is deformed tracing the deformation of the pellicle attached thereto.

PRIOR PUBLICATIONS

Publications-in-IP

[Publication-in-IP 1] Japanese Published patent application Showa 58-219023
[Publication-in-IP 2] U.S. Pat. No. 4,861,402
[Publication-in-IP 3] Japanese Examined patent application publication Showa 63-27707
[Publication-in-IP 4] Japanese Published patent application Heisei 7-168345
[Publication-in-IP 5] Japanese Published Patent Application No. 2009-25560

SUMMARY OF THE INVENTION

The Problems the Invention Seeks to Solve

In view of the above-mentioned circumstances, the present invention seeks to propose a pellicle for lithography that scarcely imparts deformation to the mask to which it is affixed.

Means to Solve the Problems

The basic concept of the present invention lies in that the pellicle is provided with an agglutinant that has a subdued adhesion strength, weaker than conventionally used agglutinants. In other words, the pellicle for lithography according to the present invention is a pellicle wherein a membrane-bonding adhesive is applied to one of the two annular faces across which a pellicle membrane is tensely bonded, and the improvement lies in that a mask-bonding agglutinant layer is bonded on the other annular face in a manner such that the mask-side face of the agglutinant is flat, and in that the adhesion strength of the agglutinant layer is in a range of 1 N/m through 100 N/m (preferably 4 N/m through 80) N/m, and preferably the flatness of the mask-side face of the agglutinant is 15 micrometers or smaller and the flatness of the membrane-side face of the membrane-bonding adhesive layer is 15 micrometers or smaller.

Result of the Invention

The pellicle for lithography according to the present invention is advantageous in that, inasmuch as the adhesion strength of the agglutinant layer is subdued to the range of 1 N/m through 100 N/m, the deformation of the agglutinant layer caused as the pellicle is attached to the mask under pressure is undone as the pressure is removed, so that the deformation of the mask that accompanies the attachment operation of the pellicle to the mask is effectively restricted.

BRIEF DESCRIPTION OF THE DRAWINGS

FIG. 3 is a schematic cross section of the pellicle for lithography of the present invention as its attachment to the mask is completed.

EMBODIMENTS OF THE INVENTION

Figure 1:
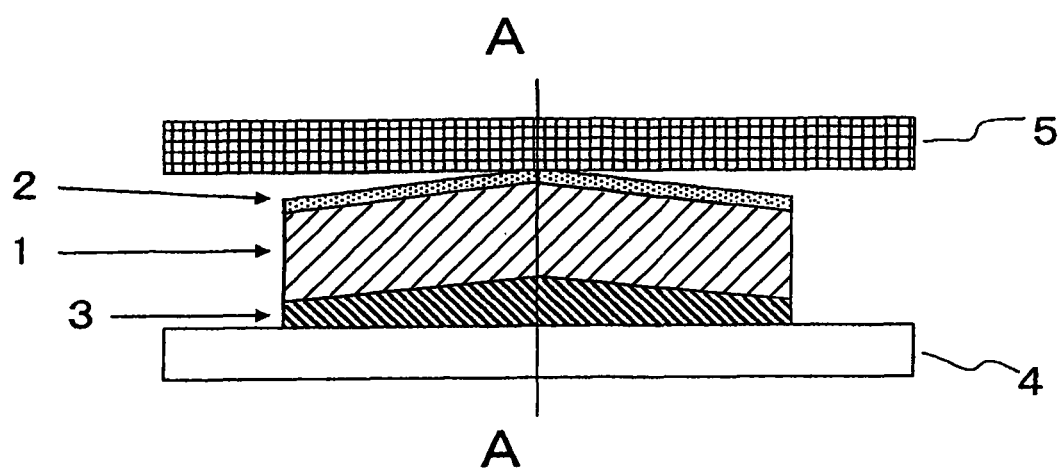
FIG. 1 is a schematic side view of a pellicle for lithography according to the present invention, as it is being attached to a mask by means of a pressure plate.

The pellicle for lithography according to the present invention is a pellicle wherein the mask-bonding agglutinant layer is bonded on an annular face of the pellicle frame in a manner such that the mask-side face of the agglutinant is flat, and in that the adhesion strength of the agglutinant layer is in a range of 1 N/m through 100 N/m, and preferably in a range of 4 N/m through 80 N/m. Incidentally, the mask-side face of the agglutinant layer is flattened (to a degree of 15 micrometers or smaller) in the following manner: after the agglutinant is applied to the annular face of the frame, the pellicle frame with the agglutinant layer facing downward is rested on a face of a means having a flatness of so high as 15 micrometers or smaller until the agglutinant layer sufficiently cures, and thereafter the pellicle frame is removed from the highly flat face of the means, with the result that the exposed face of the agglutinant layer has a flatness of the 15 micrometers or smaller. Accordingly, the deformation of the mask that accompanies the attachment of the pellicle to the mask is extremely minimized.

In the present invention, the adhesion strength of the agglutinant layer is prescribed as 1 N/m through 100 N/m, for the following reasons: when it is smaller than 1 N/m, although the bulging portion of the agglutinant layer fails to stick to the mask persistently, the agglutinant layer's adhesion strength itself is so weak that a stable bonding of the pellicle to the mask is not obtained, and when the adhesion strength of the agglutinant layer exceeds 100 N/m, the bulging portion of the agglutinant layer created by the pressure by which the pellicle is pressed on the mask sticks so strongly to the mask surface that even after the pressure is removed it keeps sticking to the mask with the result that the mask bound to the pellicle frame via the agglutinant layer is caused to deform tracing the deformation of the pellicle frame. Hence the adhesion strength of the agglutinant layer is prescribed to be 1 N/m through 100 N/m. In this range, the side faces of the agglutinant layer that are sticking to the mask while the frame is pressed on the mask stop sticking after the pressure is removed and the pellicle frame together with the agglutinant layer revert to their former shapes without affecting the mask shape. Therefore, the deformation stress of the pellicle frame felt by the mask is reduced and the mask does not deform.

The measurement of the adhesion strength of the agglutinant layer is conducted, under the normal conditions of 23+/−2 degrees centigrade and relative humidity of 50+/−5%, in accordance with the 180-degree peeling test of "the testing methods of pressure-sensitive adhesive tapes and sheets" as prescribed in JIS 20237.

Incidentally, the flatness of the mask-side face of the agglutinant layer is preferably 15 micrometers or smaller in view of the invention described in Publication-in-IP 5. Also, due to the fact that if the surface of the adhesive layer is uneven, the agglutinant layer is caused to bulge locally and stick to the mask as the pellicle is bonded to the mask by means of the pressure from the pressure plate, it is preferred that the flatness of the membrane-bonding face of the adhesive layer is 15 micrometers or smaller, like the agglutinant layer, or more preferably 10 micrometers or smaller.

The flatness was measured with a laser beam displacement sensor equipped with an X-Y stage.

Now, we will explain the invention in detail making use of the drawings.

Figure 2:
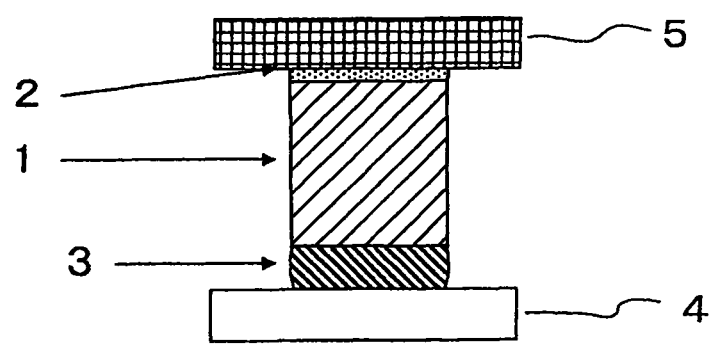
FIG. 2 is a schematic cross section of the pellicle for lithography of the present invention as the pellicle is under pressure for attachment to the mask.

FIG. 1 is a schematic side view of a pellicle for lithography according to the present invention: as the pellicle for lithography is caused to be bonded to a mask 4 by the pressure imposed by a pressure plate 5 of a pellicle mounter, that portion of the pellicle which is in the vicinity of the line A-A, where the adhesive layer 2 is convexed, receives relatively stronger pressure. Thus, receiving greater amount of load, that portions of the pellicle frame 1 and the agglutinant layer 3 which are in the vicinity of the line A-A undergo greater deformation and, as shown in FIG. 2, the side faces of the agglutinant layer 3 bulge and stick to the mask 4.

However, if the adhesion strength of the agglutinant layer 3 is 100 N/m or smaller, the side faces of the agglutinant layer 3 stop sticking to the mask upon the termination of the pressure loading and the agglutinant layer 3 and the pellicle frame 1 revert to their original shapes. Accordingly, the deformation stress of the pellicle frame 1 is reduced and barely causes the mask 4 to deform.

EXAMPLES

Example 1

A pellicle frame made of an aluminum alloy (outer dimension being 149 mm×113 mm×4.5 mm, the frame width 2 mm, flatness of both the agglutinant-side and the adhesive-side annular faces of the frame 10 micrometers) was washed in pure water, and an acrylic resin agglutinant SK-Dyne 1495 (a commercial product of Soken Chemical & Engineering Co., Ltd.) was applied to the agglutinant-side annular face of the frame and was let to sit for one hour at room temperature. A separator was laid on a surface of a quartz glass plate having a flatness of 3 micrometers, and the pellicle frame was placed on it with the agglutinant layer lying on the quartz glass plate surface via the separator. Thus the agglutinant layer on the pellicle frame was molded to have a flat face. Thereafter, the quartz glass plate was heated and kept at 70 degrees centigrade for 12 hours whereby the agglutinant was precured. After this precuring of the agglutinant, the frame was removed from the quartz glass plate and the separator was peeled off. Then, the pellicle frame was heated at 150 degrees centigrade and the curing of the agglutinant was completed.

In the next step, the opposite annular face of the frame was coated with a 6-percent concentration fluorine-containing resin solution prepared by dissolving a fluorine resin CITOP CTX-S (a commercial product of ASAHI GLASS CO., LTD.) in a fluorine-containing solvent NOVEC 7300 (a commercial product of Sumitomo 3M Limited); then, the pellicle frame was heated at 130 degrees centigrade to thereby evaporate the solvent and attain a formation of a cured adhesive layer of the fluorine-containing resin.

Next, the pellicle frame was brought to touch a pellicle membrane temporarily attached to an aluminum frame having a wider dimension than the pellicle frame in a manner such that the adhesive-bearing annular face of the frame was bonded to the pellicle membrane, and by heating the adhesive the pellicle membrane was affixed to the adhesive layer, and that part of the membrane which extends beyond the pellicle frame was trimmed off, whereupon a pellicle is completed.

It was found the adhesion strength of the agglutinant was 40 N/m, and the flatness of the mask-side surface of the agglutinant layer was 10 micrometers, and the flatness of the membrane-side surface of the adhesive layer was also 10 micrometers. Incidentally, the measurement of the adhesion strength was conducted upon a sample set aside for adhesion strength measurement; it was subjected to the 180-degree peeling method as prescribed in JIS Z0237, so that it was put on a stainless steel plate and was detached at a peeling speed of 200 mm/min. The flatness was measured with a laser beam displacement sensor equipped with an X-Y stage (and so in all the other examples).

When this pellicle was bonded to a mask having a flatness of 0.25 micrometer, the mask's flatness was changed to 0.27 micrometer. Thus, the increment was 0.02 micrometer, and this was considered sufficiently small.

Also, the mask bonded with this pellicle was let to sit at 50 degrees centigrade for one full month, and the agglutinant layer was inspected and it was found that no part of the agglutinant layer was detached from the mask, and thus the bonding strength was confirmed to be satisfactory.

The result of the example as well as other examples including comparative examples is entered in Table 1.

TABLE 1

| | Adhesion strength of agglutinant (N/m) | Increment in mask flatness (micrometer) | Bonding stability (after one month at 50° C.) |
|---|---|---|---|
| Example 1 | 40 | +0.02 | good |
| Example 2 | 80 | +0.03 | good |
| Example 3 | 4 | +0.01 | good |
| Comparative Example 1 | 333 | +0.10 | good |
| Comparative Example 2 | 0.5 | +0.01 | no good |

Example 2

A pellicle frame made of an aluminum alloy (outer dimension being 149 mm×113 mm×4.5 mm, the frame width 2 mm, flatness of both the agglutinant- and the adhesive-side annular faces of the frame 10 micrometers) was washed in pure water, and an acrylic resin agglutinant Corponyl 2260 (a commercial product of The Nippon Synthetic Chemical Industry Co., Ltd.) was applied to the agglutinant-side annular face of the frame and was let to sit for one hour at room temperature. A separator was laid on a surface of a quartz glass plate having a flatness of 3 micrometers, and the pellicle frame was placed on it with the agglutinant layer lying on the quartz glass plate surface via the separator. Thus the agglutinant layer on the pellicle frame was molded to have a flat face. Thereafter, the quartz glass plate was heated and kept at 70 degrees centigrade for 12 hours whereby the agglutinant was precured. After this precuring of the agglutinant, the frame was removed from the quartz glass plate and the separator was peeled off. Then, the pellicle frame was heated at 150 degrees centigrade and the curing of the agglutinant was completed.

Thereafter, the pellicle frame was provided with an adhesive layer and a pellicle membrane in the same manner as in Example 1, and a pellicle was likewise completed.

The adhesion strength of the agglutinant was 80 N/m, and the flatness of the mask-side surface of the agglutinant layer was 10 micrometers, and the flatness of the membrane-side surface of the adhesive layer was also 10 micrometers.

When this pellicle was bonded to a mask having a flatness of 0.25 micrometer, the mask's flatness was changed to 0.28 micrometer. Thus, the increment was 0.03 micrometer, and this was considered sufficiently small.

Also, the mask bonded with this pellicle was let to sit at 50 degrees centigrade for one full month, and the agglutinant layer was inspected and it was found that no part of the agglutinant layer was detached from the mask, and thus the bonding strength was confirmed to be satisfactory.

Example 3

A pellicle frame made of an aluminum alloy (outer dimension being 149 mm×113 mm×4.5 mm, the frame width 2 mm, flatness of both the agglutinant- and the adhesive-side annular faces of the frame 10 micrometers) was washed in pure water, and an acrylic resin agglutinant SK-Dyne 1499 (a commercial product of Soken Chemical & Engineering Co., Ltd.) was applied to the agglutinant-side annular face of the frame and was let to sit for one hour at room temperature. A separator was laid on a surface of a quartz glass plate having a flatness of 3 micrometers, and the pellicle frame was placed on it with the agglutinant layer lying on the quartz glass plate surface via the separator. Thus the agglutinant layer on the pellicle frame was molded to have a flat face. Thereafter, the quartz glass plate was heated and kept at 70 degrees centigrade for 12 hours whereby the agglutinant was precured. After this precuring of the agglutinant, the frame was removed from the quartz glass plate and the separator was peeled off. Then, the pellicle frame was heated at 150 degrees centigrade and the curing of the agglutinant was completed.

Thereafter, the pellicle frame was provided with an adhesive layer and a pellicle membrane in the same manner as in Example 1, and a pellicle was likewise completed.

The adhesion strength of the agglutinant was 4 N/m, and the flatness of the mask-side surface of the agglutinant layer was 10 micrometers, and the flatness of the membrane-side surface of the adhesive layer was also 10 micrometers.

When this pellicle was bonded to a mask having a flatness of 0.25 micrometer, the mask's flatness was changed to 0.26 micrometer. Thus, the increment was 0.01 micrometer, and this was considered sufficiently small.

Then, the mask bonded with this pellicle was let to sit at 50 degrees centigrade for one full month, and the agglutinant layer was inspected and it was found that no part of the agglutinant layer was detached from the mask, and thus the bonding strength was confirmed to be satisfactory.

Comparative Example 1

A pellicle frame made of an aluminum alloy (outer dimension being 149 mm×113 mm×4.5 mm, the frame width 2 mm, flatness of both the agglutinant-side and the adhesive-side annular faces of the frame 10 micrometers) was washed in pure water, and an acrylic resin agglutinant SK-Dyne 1223 (a commercial product of Soken Chemical & Engineering Co., Ltd.) was applied to the agglutinant-side annular face of the frame and was let to sit for one hour at room temperature. A separator was laid on a surface of a quartz glass plate having a flatness of 3 micrometers, and the pellicle frame was placed on it with the agglutinant layer lying on the quartz glass plate surface via the separator. Thus the agglutinant layer on the pellicle frame was molded to have a flat face. Thereafter, the quartz glass plate was heated and kept at 70 degrees centigrade for 12 hours whereby the agglutinant was precured. After this precuring of the agglutinant, the frame was removed from the quartz glass plate and the separator was peeled off. Then, the pellicle frame was heated at 150 degrees centigrade and the curing of the agglutinant was completed.

Next, the pellicle frame was provided with an adhesive layer and a pellicle membrane in the same manner as in Example 1, and a pellicle was likewise completed.

The adhesion strength of the agglutinant was 333 N/m, and the flatness of the mask-side surface of the agglutinant layer was 10 micrometers, and the flatness of the membrane-side surface of the adhesive layer was also 10 micrometers. When this pellicle was bonded to a mask having a flatness of 0.25 micrometer, the mask's flatness was changed to 0.35 micrometer. Thus, the increment was 0.10 micrometer, and this was considered too large.

Then, the mask bonded with this pellicle was let to sit at 50 degrees centigrade for one full month, and the agglutinant layer was inspected and it was found that no part of the agglutinant layer was detached from the mask.

Comparative Example 2

A pellicle frame made of an aluminum alloy (outer dimension being 149 mm×113 mm×4.5 mm, the frame width 2 mm, flatness of both the agglutinant-side and the adhesive-side annular faces of the frame 10 micrometers) was washed in pure water, and an acrylic resin agglutinant Corponyl 4742 (a commercial product of The Nippon Synthetic Chemical Industry Co., Ltd.) was applied to the agglutinant-side annular face of the frame and was let to sit for one hour at room temperature. A separator was laid on a surface of a quartz glass plate having a flatness of 3 micrometers, and the pellicle frame was placed on it with the agglutinant layer lying on the quartz glass plate surface via the separator. Thus the agglutinant layer on the pellicle frame was molded to have a flat face. Thereafter, the quartz glass plate was heated and kept at 70 degrees centigrade for 12 hours whereby the agglutinant was precured. After this precuring of the agglutinant, the frame was removed from the quartz glass plate and the separator was peeled off. Then, the pellicle frame was heated at 150 degrees centigrade and the curing of the agglutinant was completed.

Next, the pellicle frame was provided with an adhesive layer and a pellicle membrane in the same manner as in Example 1, and a pellicle was likewise completed.

The adhesion strength of the agglutinant was 0.5 N/m, and the flatness of the mask-side surface of the agglutinant layer was 10 micrometers, and the flatness of the membrane-side surface of the adhesive layer was also 10 micrometers. When this pellicle was bonded to a mask having a flatness of 0.25 micrometer, the mask's flatness was changed to 0.26 micrometer. Thus, the increment was 0.01 micrometer, and this was considered sufficiently small.

However, upon the termination of one month during which the mask bonded with this pellicle was let to sit at 50 degrees centigrade, the agglutinant layer was inspected and it was found that a part of the agglutinant layer was seen to have detached from the mask, and thus the bonding stability was found to be unsatisfactory.

EXPLANATION FOR REFERENCE NUMERALS

1: pellicle frame
2: adhesive layer
3: agglutinant layer
4: mask
5: pressure plate of (pellicle mounter)

What is claimed is:

1. A pellicle for lithography comprising a pellicle frame having a pair of parallel annular faces, a pellicle membrane tensely bonded on one of the annular faces via an adhesive layer, and a agglutinant layer attached to the other one of the annular faces, characterized in that an adhesion strength of the agglutinant layer is in a range of 1 N/m through 100 N/m.

2. A pellicle for lithography as claimed in claim 1, wherein the adhesion strength of the agglutinant layer is in a range of 4 N/m through 80 N/m.

3. A pellicle for lithography as claimed in claim 1, wherein that face of the agglutinant layer which is to be attached to a mask has a flatness of 15 micrometers or smaller.

4. A pellicle for lithography as claimed in claim 1, wherein that face of the adhesive layer on which the pellicle membrane is placed has a flatness of 15 micrometers or smaller.

* * * * *